United States Patent
Tanaka

(10) Patent No.: US 7,982,344 B2
(45) Date of Patent: Jul. 19, 2011

(54) PLANAR PULSE MOTOR, EXPOSURE APPARATUS, AND DEVICE MANUFACTURING METHOD

(75) Inventor: Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 240 days.

(21) Appl. No.: 12/410,920

(22) Filed: Mar. 25, 2009

(65) Prior Publication Data

US 2009/0251012 A1 Oct. 8, 2009

(30) Foreign Application Priority Data

Apr. 8, 2008 (JP) ................. 2008-100865

(51) Int. Cl.
*H02K 41/02* (2006.01)
(52) U.S. Cl. .................................. 310/12.06
(58) Field of Classification Search ............... 310/12.01, 310/12.05, 12.06, 12.13, 12.14, 12.19
See application file for complete search history.

(56) References Cited

U.S. PATENT DOCUMENTS

| | | | | |
|---|---|---|---|---|
| 6,144,119 | A * | 11/2000 | Hazelton | 310/12.06 |
| 6,445,093 | B1 * | 9/2002 | Binnard | 310/12.06 |
| 6,853,099 | B2 | 2/2005 | Uchida | |
| 6,960,846 | B2 | 11/2005 | Uchida | |
| 7,898,119 | B2 * | 3/2011 | Sato | 310/12.05 |
| 2001/0043017 | A1 * | 11/2001 | Hwang et al. | 310/12 |
| 2003/0102722 | A1 * | 6/2003 | Ueta et al. | 310/12 |

FOREIGN PATENT DOCUMENTS

| | | |
|---|---|---|
| JP | 6-121520 | 4/1994 |
| KR | 2002-0074417 A | 9/2002 |
| KR | 10-0726711 B1 | 6/2007 |

OTHER PUBLICATIONS

Korean Office Action dated Nov. 5, 2010, in related corresponding Korean Patent Appln. No. 10-2009-0029908.

* cited by examiner

*Primary Examiner* — Nguyen N Hanh
(74) *Attorney, Agent, or Firm* — Fitzpatrick, Cella, Harper & Scinto

(57) ABSTRACT

A planar pulse motor includes a movable element and a stator, wherein the movable element contains a magnetic material, and has a plurality of convex portions on a surface thereof facing the stator. The stator includes a plurality of magnetic field generators to drive the movable element, and each magnetic field generator includes a yoke having a plurality of teeth and a coil which excites the yoke. The planar pulse motor includes a controller which controls rotation of the movable element by energizing magnetic field generators selected from magnetic field generators, whose regions do not include a center line of the movable element along a driving direction of the movable element and do not include portions outside a region facing the movable element, of the plurality of magnetic field generators.

9 Claims, 9 Drawing Sheets

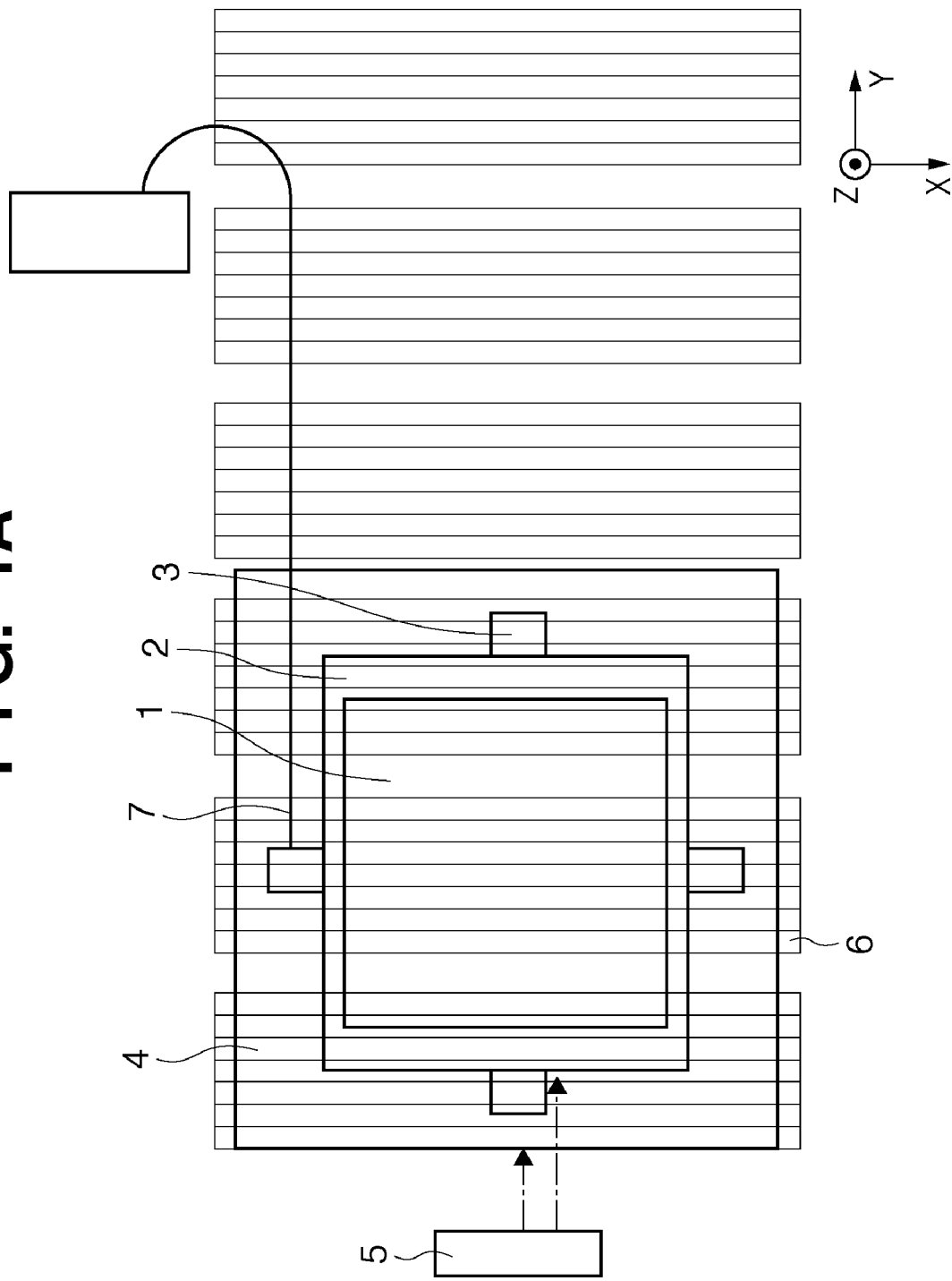

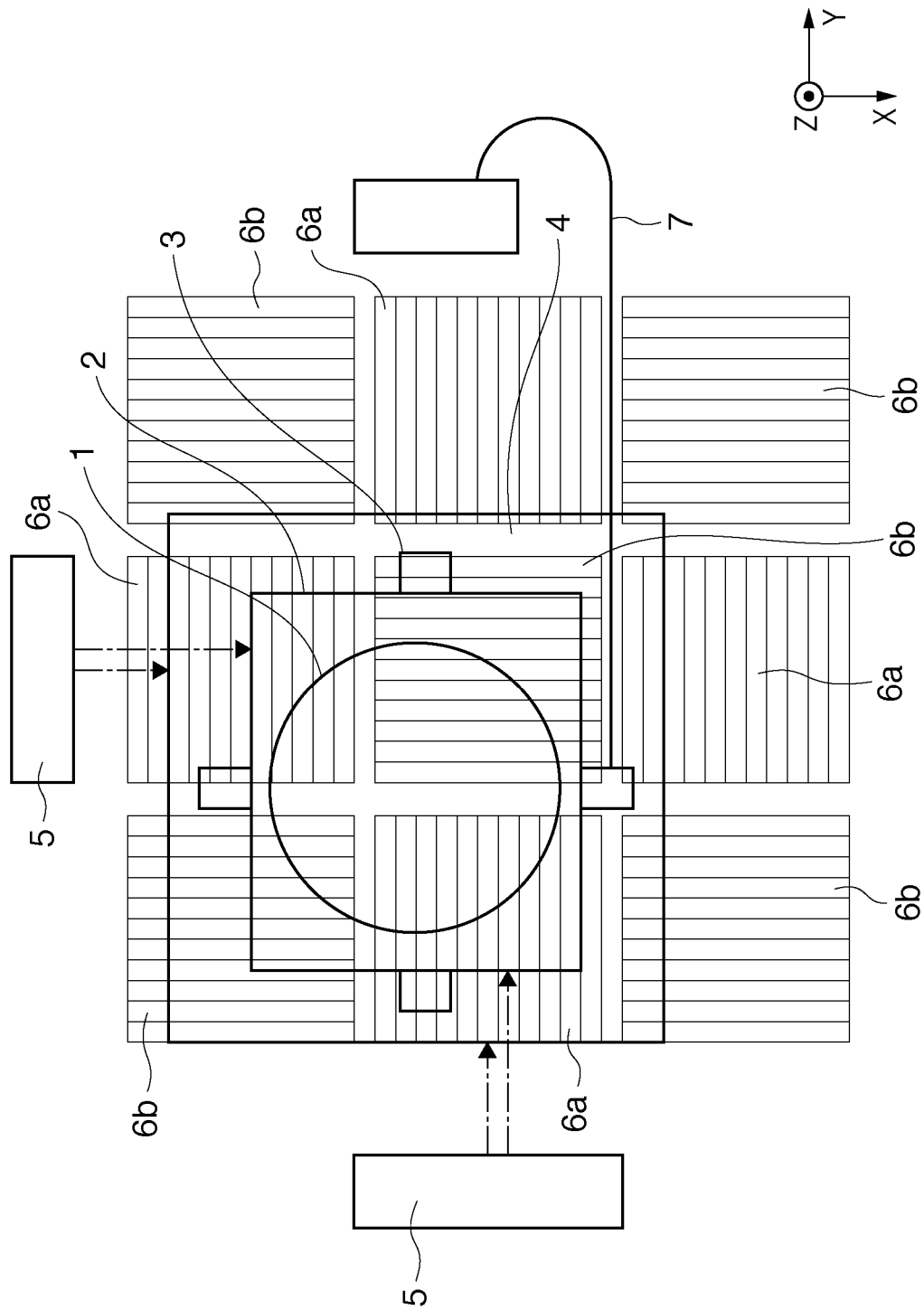

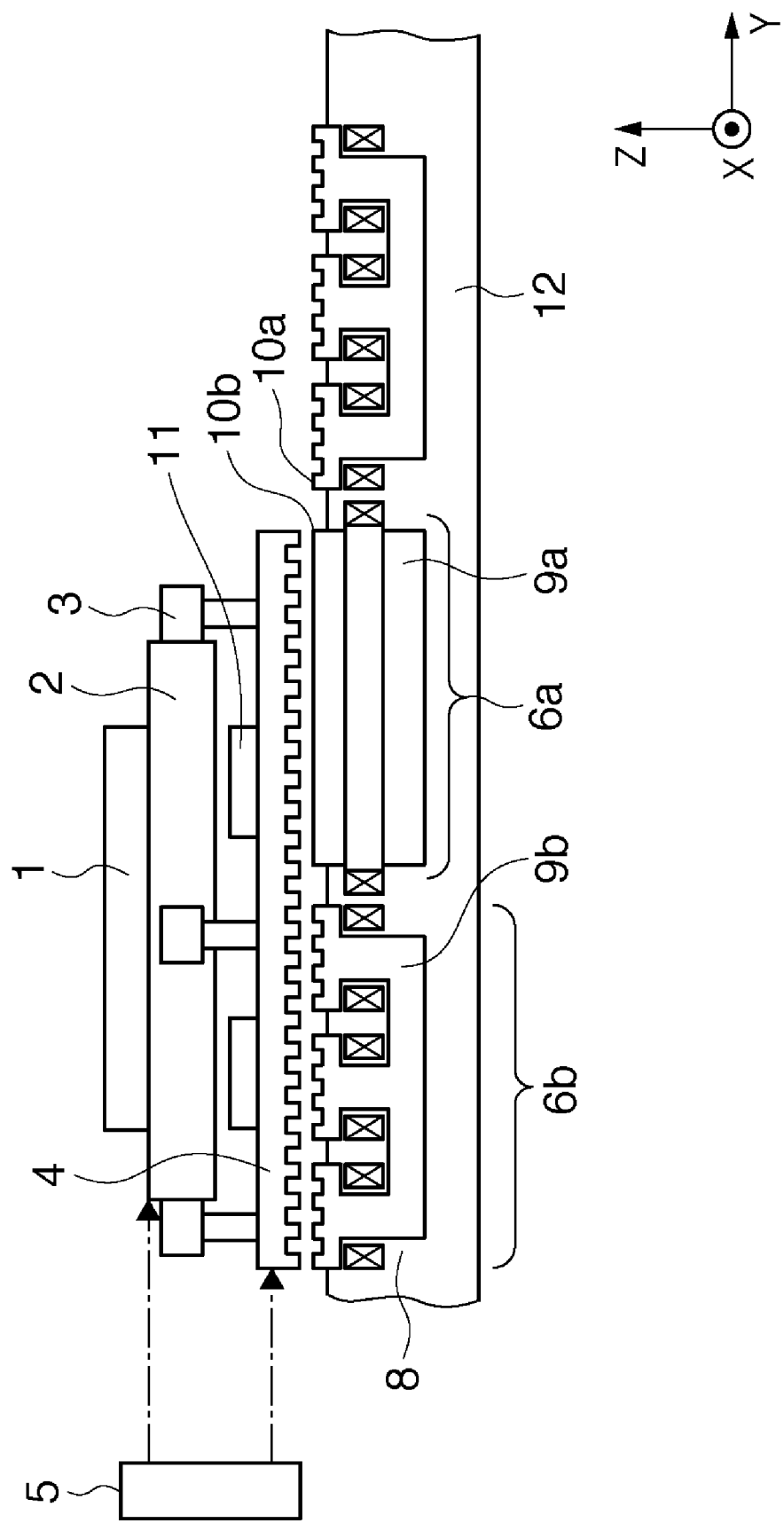

PLANAR PULSE MOTOR, EXPOSURE APPARATUS, AND DEVICE MANUFACTURING METHOD

BACKGROUND OF THE INVENTION

1. Field of the Invention

The present invention relates to a planar pulse motor, an exposure apparatus including the planar pulse motor, and a device manufacturing method using the exposure apparatus.

2. Description of the Related Art

A planar pulse motor has the feature that it requires no guide for regulating the position of a movable element in the translation direction. For this reason, a planar pulse motor is advantageous to simplifying, for example, a substrate positioning mechanism in an exposure apparatus which transfers the pattern of an original onto a substrate.

Japanese Patent Laid-Open No. 6-121520 discloses a surface pulse motor including a movable element made of a flat magnetic material having projecting teeth on its surface, and a stator made of five-phase electromagnets. In the surface pulse motor described in Japanese Patent Laid-Open No. 6-121520, the movable element includes no coils and can therefore have a light weight.

In general, the exposure apparatus needs to control the substrate along a total of six axial directions: the X, Y, and Z directions and the rotation directions about the X-, Y-, and Z-axes. In the planar pulse motor, as the movable element rotates upon being applied with a moment while the movable element is translated, it may go out of control. Japanese Patent Laid-Open No. 6-121520 neither discloses nor suggests details of rotation control of the movable element.

SUMMARY OF THE INVENTION

The present invention provides a technique advantageous to rotation control of a movable element in a planar pulse motor.

One aspect of the present invention provides a planar pulse motor including a movable element and a stator, wherein the movable element contains a magnetic material, and has a plurality of convex portions on a surface thereof facing the stator, the stator includes a plurality of magnetic field generators to drive the movable element, and each magnetic field generator includes a yoke having a plurality of teeth and a coil which excites the yoke, and the planar pulse motor includes a controller which controls rotation of the movable element by energizing magnetic field generators selected from magnetic field generators, whose regions do not include a center line of the movable element along a driving direction of the movable element and do not include portions outside a region facing the movable element, of the plurality of magnetic field generators.

Further features of the present invention will become apparent from the following description of exemplary embodiments with reference to the attached drawings.

BRIEF DESCRIPTION OF THE DRAWINGS

FIG. 1A is a view schematically showing the arrangement of a single-axis pulse motor (linear pulse motor) according to the first embodiment of the present invention;

FIG. 2A is a view schematically showing the arrangement of a planar pulse motor according to the second embodiment of the present invention;

FIG. 2B is a view schematically showing the arrangement of the planar pulse motor according to the second embodiment of the present invention;

DESCRIPTION OF THE EMBODIMENTS

Preferred embodiments of the present invention will be described below with reference to the accompanying drawings.

First Embodiment

Figure 1B:
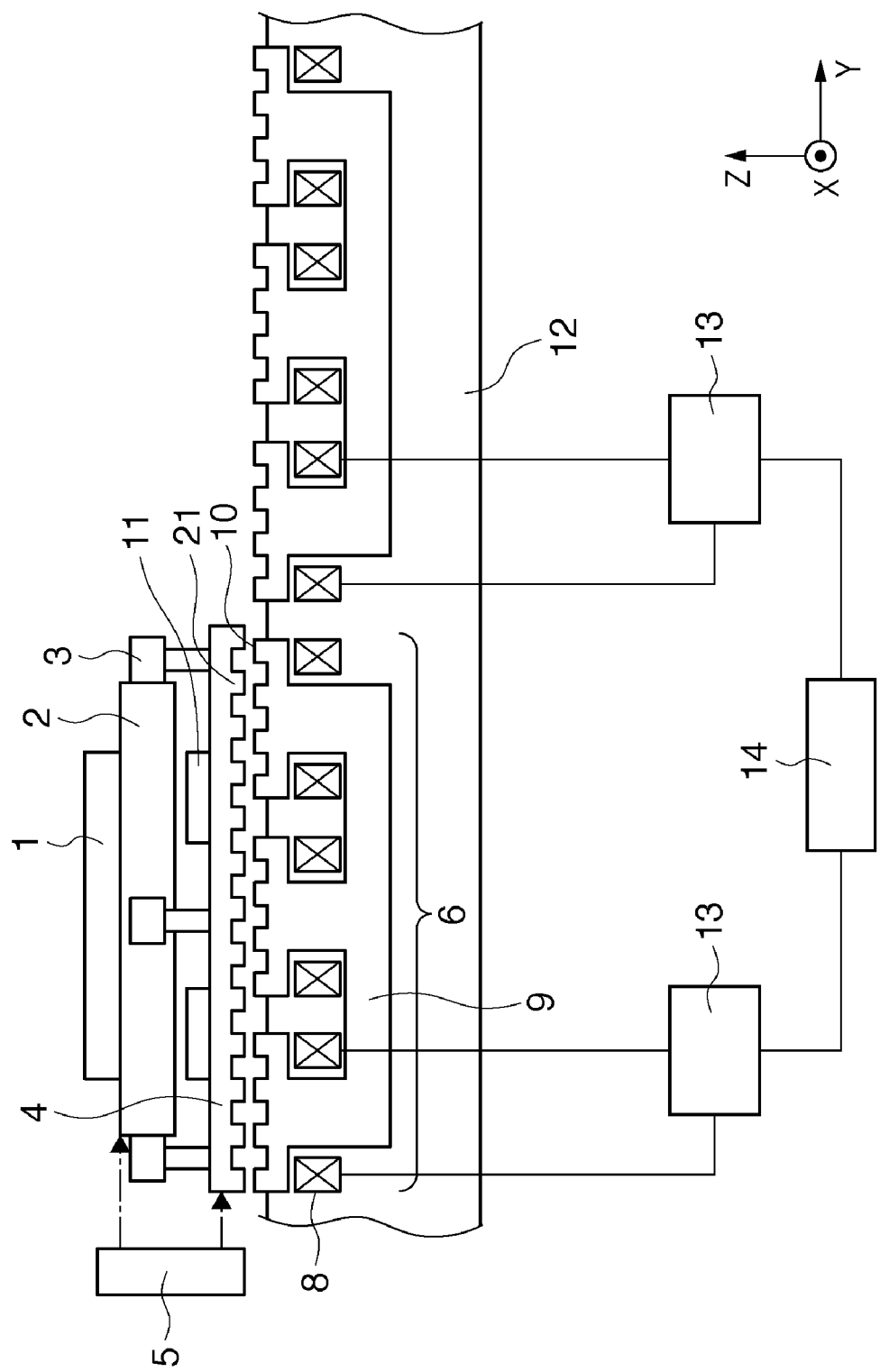
FIG. 1B is a view schematically showing the arrangement of the single-axis pulse motor (linear pulse motor) according to the first embodiment of the present invention.

FIGS. 1A and 1B are views schematically showing the arrangement of a single-axis pulse motor (linear pulse motor) according to the first embodiment of the present invention. The single-axis pulse motor according to the first embodiment includes a movable element 4 and stator 12. The dimension of the movable element 4 in its driving direction is typically smaller than that of the stator 12.

The movable element 4 contains a magnetic material, and has, on its surface facing the stator 12, a regular array of a plurality of convex portions 21. The plurality of convex portions 21 are arrayed with periodicity in at least the driving direction of the movable element 4. The stator 12 includes an array of a plurality of magnetic field generators 6, and can be configured as a surface plate. Each magnetic field generator 6 includes a yoke 9 and coils 8 which excite the yoke 9. The plurality of coils 8 are independently driven by a plurality of driving circuits 13. Each yoke 9 contains a magnetic material, and has, on its surface facing the movable element 4, a regular array of a plurality of teeth 10. The plurality of teeth 10 are arrayed with periodicity in at least the driving direction of the movable element 4. Excitation of the yoke 9 by the coils 8 forms a magnetic circuit which runs through the teeth 10 of the stator 12 and the convex portions 21 of the movable element 4. With this operation, a thrust acts on the movable element 4 so that it moves relative to the stator 12.

The movable element 4 can be configured as a stage or a part of it. The movable element 4 can mount, for example, a fine moving stage 2 and a driving mechanism 3 which drives the fine moving stage 2. If the single-axis pulse motor according to this embodiment is mounted in an exposure apparatus, it can be configured as a part of a substrate positioning mechanism which positions a substrate, or an original positioning mechanism which positions an original. In the substrate positioning mechanism, the fine moving stage 2 can mount a substrate chuck which holds a substrate 1. The movable element 4 can be cooled down by a cooling unit 11. The driving mechanism 3 which drives the fine moving stage 2, the cooling unit 11, and the like can be supplied with, e.g., power and a refrigerant via flexible interfaces (e.g., a flexible cable and a flexible tube) 7.

The movable element 4 does not mount an exciting coil to move it, so no heat is generated upon driving the exciting coil. However, the movable element 4 preferably includes a cooling unit 11 in order to remove heat generated due to a magnetic hysteresis loss and an eddy current generated in the movable element 4. Note that the cooling unit 11 is unnecessary if the amount of heat generation falls within a tolerance.

A measuring device 5 such as a laser interferometer measures the positions of the movable element 4 and fine moving stage 2. A controller 14 controls the plurality of driving circuits 13 based on the measurement result obtained by the measuring device 5. The controller 14 operates the plurality of driving circuits 13 based on the positioning target position of the movable element 4 and the position of the movable element 4 obtained based on the measurement result obtained by the measuring device 5. At this time, it is also possible to always supply an electric current to the coils 8 of all the magnetic field generators 6.

Nevertheless, to reduce power consumption and suppress heat generation, coils 8 of a given magnetic field generator 6 above which the movable element 4 is not set are preferably supplied with an electric current immediately before the movable element 4 moves to above the given magnetic field generator 6. If an electric current is supplied to the coils 8 of the given magnetic field generator 6 while the movable element 4 is set above the magnetic field generator 6, it may generate a disturbance to control of the movable element 4. If the amount of heat generation of the coils 8 falls outside a tolerance, a cooling unit for cooling down the coils 8 can be provided.

Second Embodiment

FIGS. 2A and 2B are views schematically showing the arrangement of a planar pulse motor according to the second embodiment of the present invention. In this embodiment as well, the dimension of a movable element 4 in its driving direction is typically smaller than that of a stator 12.

In this embodiment, a measuring device 5 measures the position of the movable element 4 in the X direction (first direction) and Y direction (second direction), and the angular velocity ωZ of rotation of the movable element 4 about the Z-axis. Note that the X, Y, and Z directions are orthogonal to each other and based on an X-Y-Z coordinate system. A controller 14 corresponding to that in the first embodiment drives the movable element 4 in a two-dimensional plane based on the measurement result obtained by the measuring device 5.

In the planar pulse motor according to this embodiment, the stator 12 includes first magnetic field generators 6a each of which is used for driving in the X-axis direction and includes a yoke 9a having teeth 10a, and second magnetic field generators 6b each of which is used for driving in the Y-axis direction and includes a yoke 9b having teeth 10b. The first and second magnetic field generators 6a and 6b can have arrangements similar to that of the magnetic field generator 6 according to the first embodiment. Note that the teeth 10a of the first magnetic field generator 6a are arrayed with periodicity in at least the X-axis direction, and the teeth 10b of the second magnetic field generator 6b are arrayed with periodicity in at least the Y-axis direction.

In this embodiment, a plurality of convex portions 21 of the movable element 4 are arrayed with periodicity in at least the X- and Y-axis directions. This is to drive the movable element 4 in the X- and Y-axis directions. The first and second magnetic field generators 6a and 6b are preferably arrayed in a checkerboard pattern, as illustrated in FIG. 2A. In other words, it is preferable to arrange one of the first and second magnetic field generators in a portion indicated by a first color, and arrange the other one of them in a portion indicated by a second color.

Figure 3:
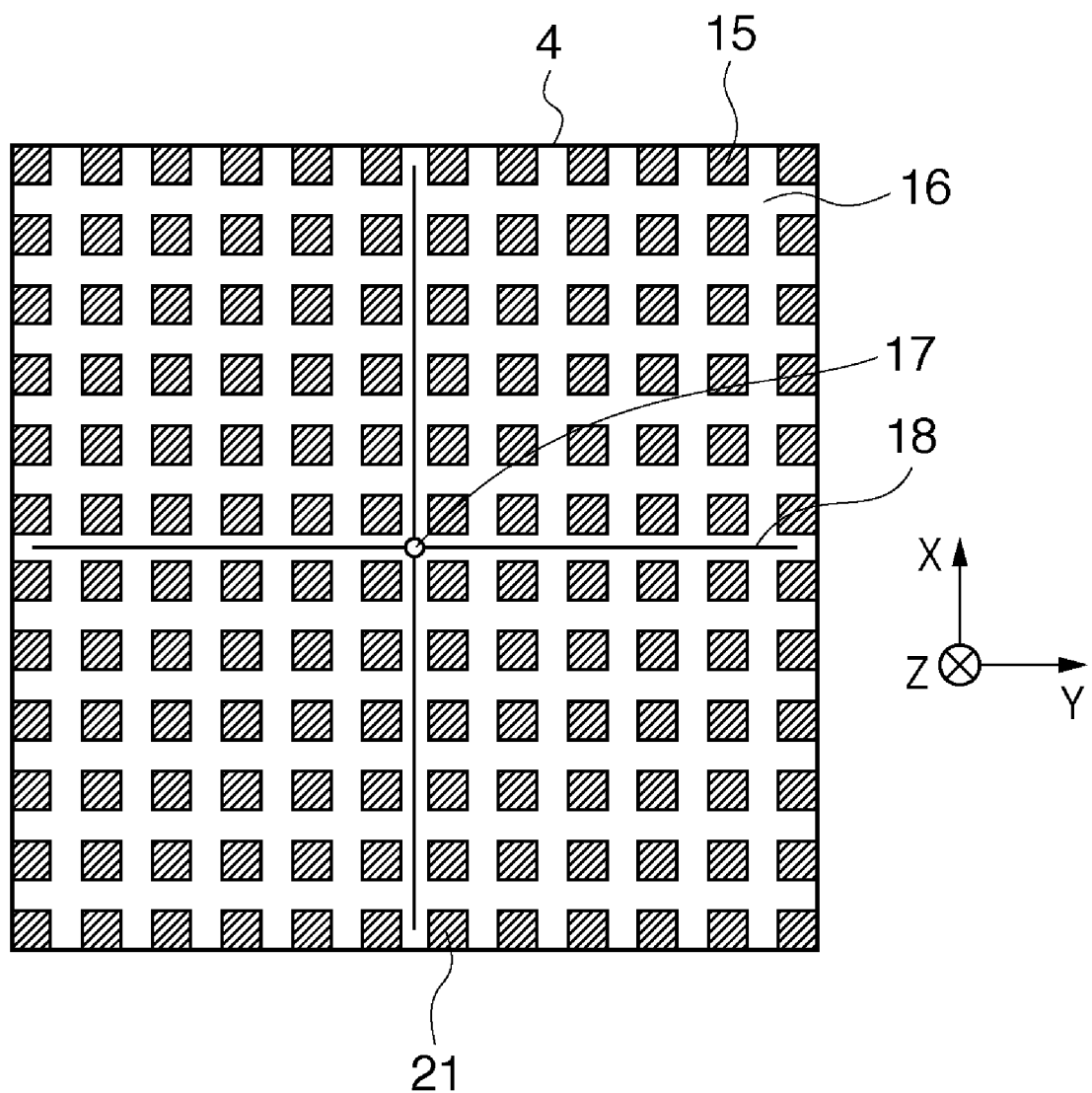
FIG. 3 is a view showing an example of the array of a plurality of convex portions on a movable element.

FIG. 3 is a view showing an example of the array of the plurality of convex portions 21 of the movable element 4. The plurality of convex portions 21 are arrayed in a matrix of a plurality of rows and a plurality of columns. A region which isolates the convex portions 21 from each other is filled with a nonmagnetic material 16 so that the movable element 4 has a flat surface facing the stator 12. A preferable example of the nonmagnetic material to fill is a resin.

The movable element 4 includes a nozzle 17 which constitutes an air bearing. The movable element 4 is levitated above the guide surface (the surface facing the movable element 4) of the stator 12 by blowing a high-pressure gas from the nozzle 17 to the movable element 4. The preferable amount of levitation of the movable element 4 is generally about 5 to 20 μm. The surface of the movable element 4 facing the stator 12, and the surface (guide surface) of the stator 12 facing the movable element 4 preferably have a flatness on the order of, e.g., 1 to 2 μm.

Figure 4:
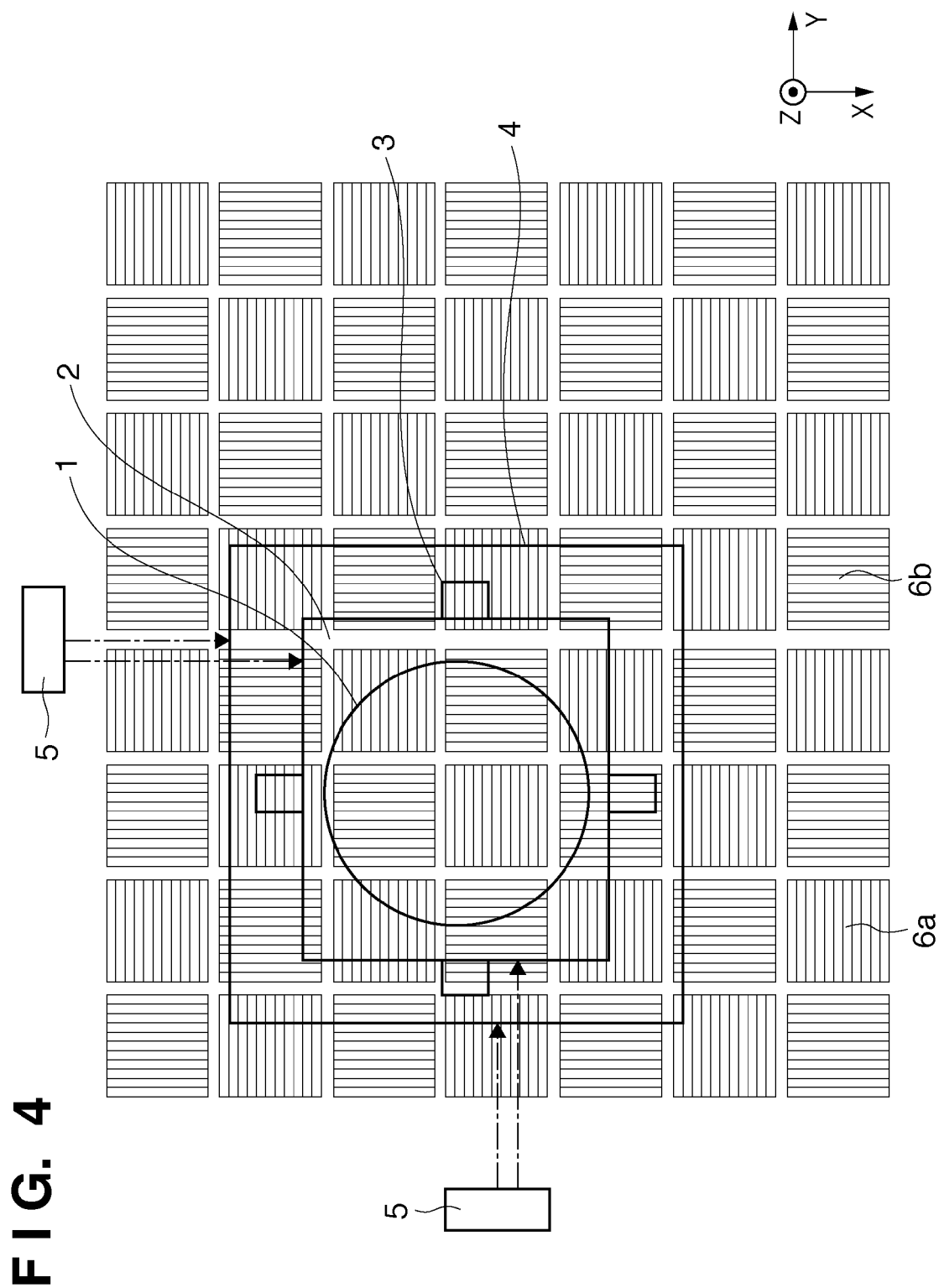
FIG. 4 is a view showing another example of the array of magnetic field generators.

FIG. 4 is a view showing another example of the array of the first and second magnetic field generators 6a and 6b. In this array example as well, the first and second magnetic field generators 6a and 6b are arrayed in a checkerboard pattern. The size of each magnetic field generator relative to the movable element 4 in the array example shown in FIG. 4 is smaller than that in the array example shown in FIG. 2A.

Figure 6:
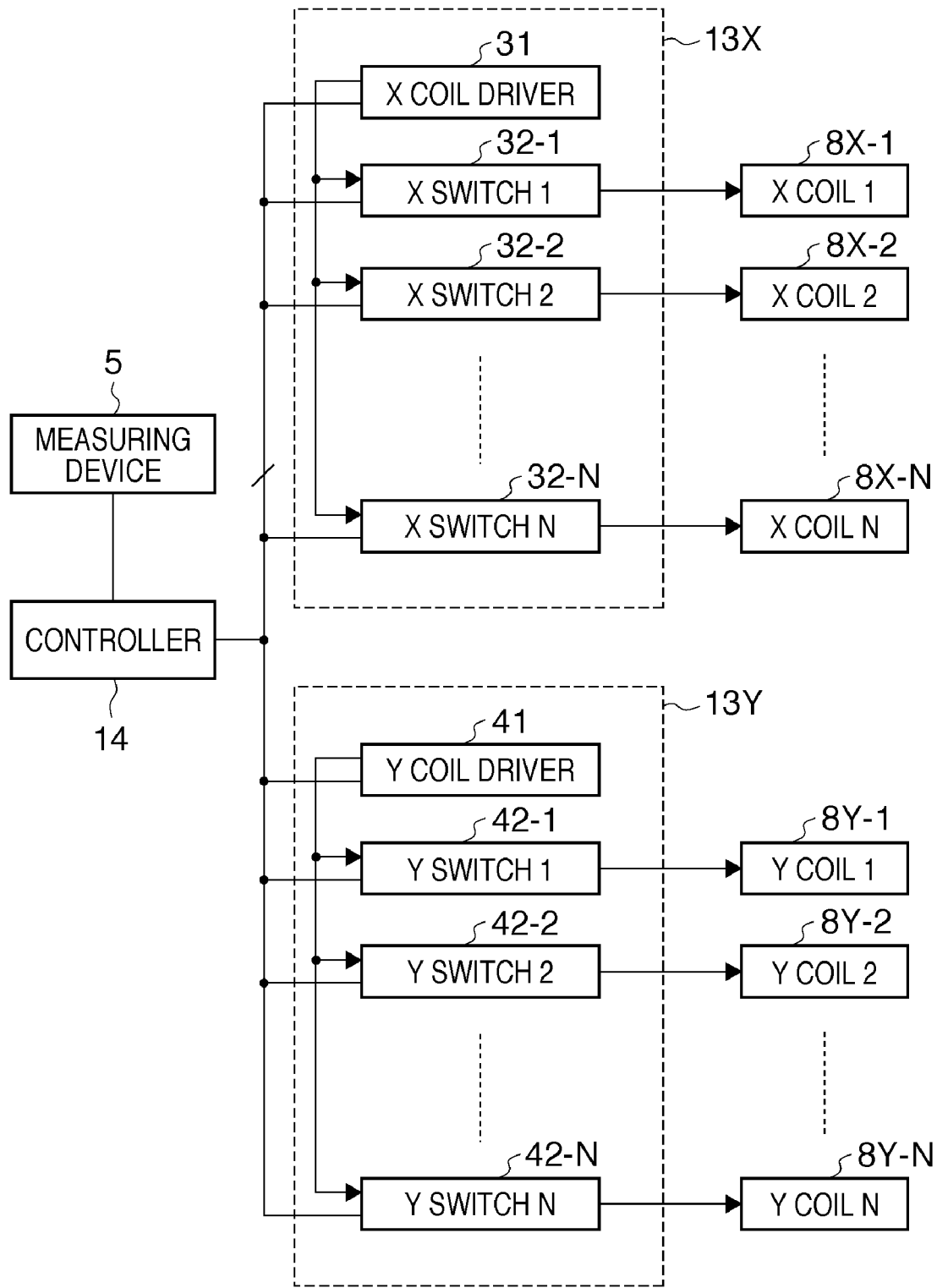
FIG. 6 is a block diagram showing an example of the configuration of a control system which controls the position and rotation of the movable element by controlling the magnetic field generators.

FIG. 6 is a view showing an example of the configuration of a control system which controls the position and rotation of the movable element 4 by controlling the first and second magnetic field generators 6a and 6b. A control system 100 exemplified in FIG. 6 includes an X-direction driving circuit 13X and Y-direction driving circuit 13Y corresponding to the driving circuits 13 according to the first embodiment. The X-direction driving circuit 13X selectively supplies an electric current to X coils 1 to N (8X-1 to 8X-N) serving as coils 8 of the first magnetic field generators 6a for driving in the X-axis direction. The Y-direction driving circuit 13Y selectively supplies an electric current to Y coils 1 to N (8Y-1 to 8Y-N) serving as coils 8 of the second magnetic field generator 6b for driving in the Y-axis direction.

The X-direction driving circuit 13X includes, for example, an X coil driver 31, and X switches 32-1 to 32-N which serve to supply the electric current from the X coil driver 31 to the X coils 8X-1 to 8X-N in a one-to-one correspondence in accordance with a command from the controller 14. The Y-direction driving circuit 13Y includes, for example, a Y coil driver 41, and Y switches 42-1 to 42-N which serve to supply the electric current from the Y coil driver 41 to the Y coils 8Y-1 to 8Y-N in a one-to-one correspondence in accordance with a command from the controller 14.

Control of the movable element 4 by the control system 100 will be explained in detail next with reference to FIG. 5. A case in which rotation (yawing) of the movable element 4 about the Z-axis is controlled when the planar pulse motor drives the movable element 4 in the X direction will be explained herein as one example. Because rotation of the planar pulse motor about the Z-axis is generally not regulated by, e.g., a guide, the planar pulse motor requires controlling the angular velocity of the rotation to a target value.

Figure 5:
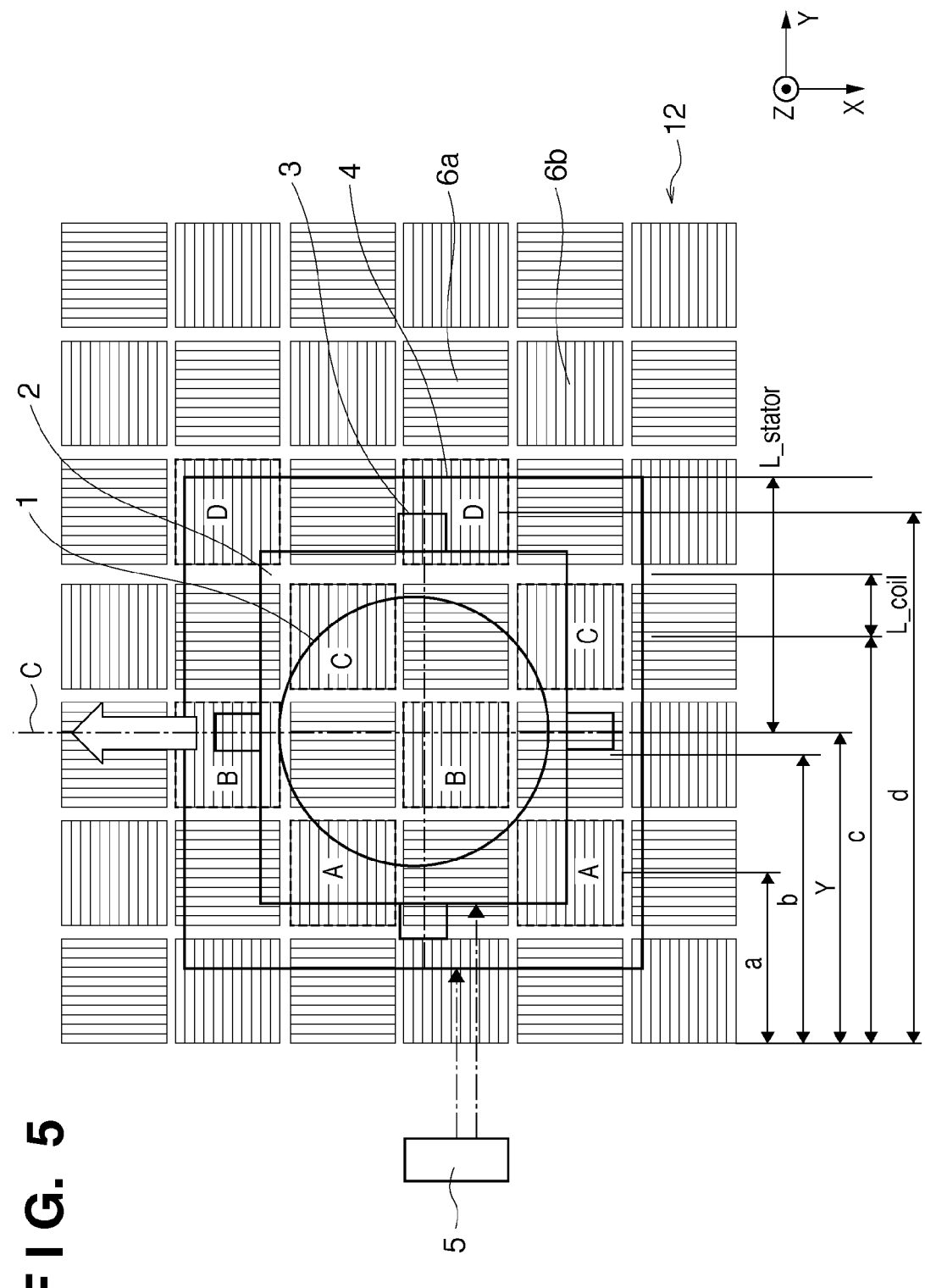
FIG. 5 is a view for exemplifying control of the movable element by a control system.

Referring to FIG. 5, C indicates the center line which passes through the center of the movable element 4. Note that center lines C can be designed to run along the driving direction (e.g., the X and Y direction) of the movable element 4 and pass through the center of gravity of the movable element 4. In rotation (yawing) control of the movable element 4 about the Z-axis by the controller 14, coils of magnetic field generators whose regions include both sides of the center line C and which are indicated by label "B" are not energized. Coils of magnetic field generators whose regions include portions outside a region facing the movable element 4 and which are indicated by label "D" are not energized, either. In other words, in rotation (yawing) control of the movable element 4 about the Z-axis by the controller 14, magnetic field generators to energize are selected from those whose regions do not include the center line C and do not include portions outside a region facing the movable element 4.

Consequently, in driving the movable element 4 in the X-axis direction, the controller 14 performs control so as to energize coils of magnetic field generators indicated by labels "A" and "C". To achieve this control, the positional relationship between the movable element 4 and each magnetic field generator is calculated in real time based on the measurement result obtained by the measuring device 5. Then, the controller 14 energizes coils of magnetic field generators whose regions do not include the center line of the movable element 4 along its driving direction and do not include portions outside a region facing the movable element 4 and which can drive the movable element 4 in its driving direction. If magnetic field generators whose regions include the center line of the movable element 4 along its driving direction are energized, this generates a moment in the movable element 4, resulting in complication of arithmetic operation for moment control. Also, if magnetic field generators whose regions include portions outside a region facing the movable element 4 are energized, this generates a moment in the movable element 4. Energization of magnetic field generators whose regions are completely outside a region facing the movable element 4 merely increases power consumption and heat generation, and does not contribute to driving the movable element 4 at all.

Referring to FIG. 5, Y indicates the Y-coordinate of the center of the movable element 4, and a, b, c, and d indicate the Y-coordinates of the magnetic field generators indicated by labels "A", "B", "C", and "D". Let M be the moment to be generated around the center of gravity of the movable element 4. Let Fa be the force, required to generate a moment, of a thrust produced by the magnetic field generators indicated by label "A". Let Fc be the force, required to generate a moment, of a thrust produced by the magnetic field generators indicated by label "C". Assuming that a clockwise moment is the positive moment, and forces Fa and Fc generated in the X-axis direction are the positive forces, we have:

$$M=-Fa(Y-a)+Fc(c-Y) \quad (1)$$

Moreover, because thrusts to generate a moment need to balance out in total in the translation direction, we have:

$$Fa+Fc=0 \quad (2)$$

The controller 14 can therefore calculate the two forces Fa and Fc based on equations (1) and (2).

The forces Fa and Fc are required only for moment control. Hence, the thrust to be produced by the magnetic field generators indicated by label "A" or "C" has a value obtained by adding the driving force of the movable element 4 in the translation direction to the force Fa or Fc.

Letting L_coil be a half of the dimension, in the Y direction, of the magnetic field generator indicated by label "B", this magnetic field generator satisfies:

$$Y-b<L\_coil \quad (3)$$

Also, letting L_stator be a half of the dimension of the stator 12 in the Y-axis direction, the magnetic field generator indicated by label "D" satisfies:

$$Y+L\_stator-d<L\_coil \quad (4)$$

Thus, the controller 14 selects, as magnetic field generators for moment control, magnetic field generators which satisfy:

$$|Y-Y\_coil|>L\_coil \quad (5)$$

$$|Y+L\_stator-Y\_coil|>L\_coil \quad (6)$$

where Y_coil is the Y-coordinate of each magnetic field generator.

Although a case in which the movable element 4 is driven in the X-axis direction has been exemplified above, moment control can be performed using the magnetic field generators for X-direction driving even when the movable element 4 is driven in an oblique direction. In this case, the Y-coordinate indicated by "Y" is a variable which changes with time upon driving the movable element. Also, although the magnetic field generators for driving in the X-axis direction are used for moment control of the movable element herein, the same moment direction control of the movable element can be performed even by using the magnetic field generators for driving in the Y-axis direction. It is also possible to use both the magnetic field generators for driving in the X- and Y-axis directions.

Third Embodiment

Figure 7:
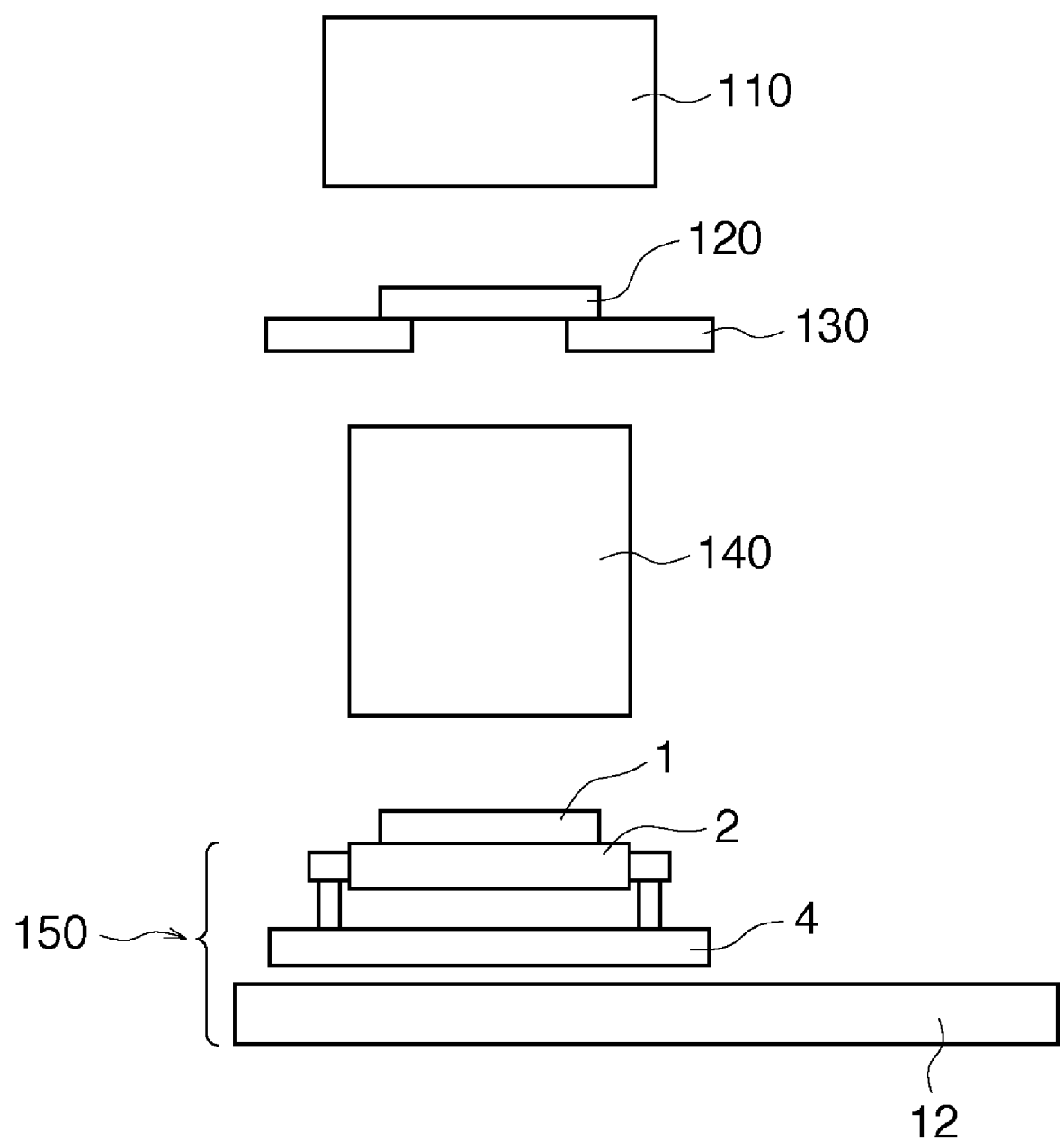
FIG. 7 is a view showing the schematic arrangement of an exposure apparatus according to the third embodiment of the present invention.

FIG. 7 is a view showing the schematic arrangement of an exposure apparatus according to the third embodiment of the present invention. The exposure apparatus according to this embodiment is configured to project the pattern of an original (also called a reticle or a mask) 120 onto a substrate (e.g., a wafer or a glass plate) 1 by a projection optical system 140 to expose the substrate 1. The substrate 1 is coated with a photosensitive agent, and the pattern of the original 120 is transferred onto the substrate 1 by this exposure. The original 120 is held by an original 120 and illuminated by an illumination optical system 110. The substrate 1 is positioned by a positioning mechanism 150.

The positioning mechanism 150 can be configured according to, for example, the second embodiment. More specifically, the positioning mechanism 150 includes the planar pulse motor according to the second embodiment, and the substrate 1 can be held by a substrate chuck arranged on a movable element 4 of the planar pulse motor.

[Device Manufacturing Method]

A device manufacturing method according to a preferred embodiment of the present invention is suitable for manufacturing, for example, a semiconductor device and a liquid crystal device. The method can include a step of transferring the pattern of an original onto a photosensitive agent applied on a substrate using the above-described exposure apparatus, and a step of developing the photosensitive agent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-100865, filed Apr. 8, 2008, which is hereby incorporated by reference herein in its entirety.

What is claimed is:

1. A planar pulse motor including a movable element and a stator, wherein
the movable element contains a magnetic material, and has a plurality of convex portions on a surface thereof facing the stator,
the stator includes a plurality of magnetic field generators to drive the movable element, and each magnetic field generator includes a yoke having a plurality of teeth and a coil which excites the yoke, and
the planar pulse motor includes a controller which controls rotation of the movable element by energizing magnetic field generators selected from magnetic field generators, whose regions do not include a center line of the movable element along a driving direction of the movable element and do not include portions outside a region facing the movable element, of the plurality of magnetic field generators.

2. The motor according to claim 1, wherein the controller controls rotation of the movable element by energizing magnetic field generators, whose regions do not include the center line of the movable element along the driving direction of the movable element and do not include the portions outside the region facing the movable element and which can drive the movable element in the driving direction, of the plurality of magnetic field generators.

3. The motor according to claim 1, wherein
the plurality of magnetic field generators include a plurality of first magnetic field generators to drive the movable element in a first direction, and a plurality of second magnetic field generators to drive the movable element in a second direction perpendicular to the first direction, and
the plurality of first magnetic field generators and the plurality of second magnetic field generators are arrayed in a checkerboard pattern.

4. The motor according to claim 3, wherein the movable element includes a center line which runs along the first direction and passes through a center of gravity thereof.

5. The motor according to claim 3, wherein the movable element includes center lines which run along the first direction and the second direction and pass through a center of gravity thereof.

6. The motor according to claim 1, wherein a dimension of the movable element in the driving direction is smaller than a dimension of the stator in the driving direction.

7. The motor according to claim 6, wherein, of the coils of the plurality of magnetic field generators, coils to be energized are selected in accordance with a position of the movable element.

8. An exposure apparatus which transfers a pattern of an original onto a substrate, the apparatus comprising:
a positioning mechanism which positions the substrate; and
a projection optical system which projects the pattern of the original onto the substrate,
wherein the positioning mechanism includes a planar pulse motor defined in claim 1, and the substrate is held by a substrate chuck arranged on a movable element of the planar pulse motor.

9. A device manufacturing method comprising the steps of:
exposing a substrate coated with a photosensitive agent by an exposure apparatus defined in claim 8; and
developing the photosensitive agent.

* * * * *